(12) United States Patent
Smith et al.

(10) Patent No.: US 8,896,075 B2
(45) Date of Patent: Nov. 25, 2014

(54) SEMICONDUCTOR RADIATION DETECTOR WITH THIN FILM PLATINUM ALLOYED ELECTRODE

(75) Inventors: Gary L. Smith, Forney, TX (US); Csaba Szeles, Allison Park, PA (US)

(73) Assignee: eV Products, Inc., Saxonburg, PA (US)

( * ) Notice: Subject to any disclaimer, the term of this patent is extended or adjusted under 35 U.S.C. 154(b) by 98 days.

(21) Appl. No.: 12/358,393

(22) Filed: Jan. 23, 2009

(65) Prior Publication Data

US 2009/0218647 A1  Sep. 3, 2009

Related U.S. Application Data

(60) Provisional application No. 61/022,836, filed on Jan. 23, 2008.

(51) Int. Cl.
| H01L 31/00 | (2006.01) |
| H01L 31/0224 | (2006.01) |
| H01L 27/146 | (2006.01) |

(52) U.S. Cl.
CPC ....... H01L 31/0224 (2013.01); *H01L 27/14676* (2013.01)
USPC ...... 257/429; 257/428; 257/448; 257/27.146; 257/E31.11

(58) Field of Classification Search
USPC ............................................. 257/429, E31.11
See application file for complete search history.

(56) References Cited

U.S. PATENT DOCUMENTS

| 1,169,753 A | 1/1916 | Peschko |
| 1,545,234 A | 7/1925 | Cohn |
| 1,935,897 A | 11/1933 | Wise |
| 2,129,721 A | 9/1938 | Wise |
| 2,138,599 A | 11/1938 | Gwyn, Jr. |
| 2,172,512 A | 9/1939 | Kilgallon |
| 2,189,571 A | 2/1940 | Sivil et al. |
| 2,216,495 A | 10/1940 | Loebich |
| 2,222,544 A | 11/1940 | Spanner et al. |
| 2,273,805 A | 2/1942 | Wise et al. |
| 2,273,806 A | 2/1942 | Wise et al. |
| 2,279,763 A | 4/1942 | Sivil |
| 2,300,286 A | 10/1942 | Gwyn, Jr. |
| 2,344,597 A * | 3/1944 | Chaston et al. ............... 420/466 |
| 2,406,172 A | 8/1946 | Smithells |
| 2,566,283 A | 8/1951 | Dowson |
| 2,636,819 A | 4/1953 | Streicher |

(Continued)

OTHER PUBLICATIONS

T. Biggs, et al., "The Hardening of Platinum Alloys for Potential Jewellery Application," Platinum Metals Review, Jan. 2005, pp. 2-15, vol. 49, Issue 1.

(Continued)

*Primary Examiner* — Minh-Loan T Tran
*Assistant Examiner* — Fazli Erdem
(74) *Attorney, Agent, or Firm* — Clark Hill PLC

(57) ABSTRACT

A compound semiconductor radiation detector includes a body of compound semiconducting material having an electrode on at least one surface thereof. The electrode includes a layer of a compound of a first element and a second element. The first element is platinum and the second element includes at least one of the following: chromium, cobalt, gallium, germanium, indium, molybdenum, nickel, palladium, ruthenium, silicon, silver, tantalum, titanium, tungsten, vanadium, zirconium, manganese, iron, magnesium, copper, tin, or gold. The layer can further include sublayers, each of which is made from a different one of the second elements and platinum as the first element.

16 Claims, 3 Drawing Sheets

(56) References Cited

U.S. PATENT DOCUMENTS

| | | | |
|---|---|---|---|
| 2,938,788 | A | 5/1960 | Ruthardt |
| 3,134,671 | A | 5/1964 | Prosen |
| 3,357,825 | A | 12/1967 | Douglass |
| 3,640,705 | A | 2/1972 | Selman et al. |
| 3,716,356 | A | 2/1973 | Burnett |
| 3,748,712 | A | 7/1973 | Karawin |
| 3,989,515 | A | 11/1976 | Reiff |
| 4,012,228 | A | 3/1977 | Dudek et al. |
| 4,062,676 | A | 12/1977 | Knosp |
| 4,165,983 | A | 8/1979 | Bourne et al. |
| 4,205,982 | A | 6/1980 | German |
| 4,828,933 | A | 5/1989 | McGill et al. |
| 4,980,245 | A | 12/1990 | Marino |
| 5,472,333 | A | 12/1995 | van der Zel |
| 5,484,569 | A | 1/1996 | Klein et al. |
| 5,518,691 | A | 5/1996 | Muragishi et al. |
| 5,833,774 | A | 11/1998 | Klein et al. |
| 5,846,352 | A | 12/1998 | Kretchmer |
| 5,952,687 | A * | 9/1999 | Kawakubo et al. ........... 257/296 |
| 6,242,104 | B1 | 6/2001 | Taylor et al. |
| 6,562,158 | B1 | 5/2003 | Kretchmer |
| 7,118,707 | B2 | 10/2006 | Robinson |
| 7,728,304 | B2 * | 6/2010 | Chen et al. ................ 250/370.13 |
| 8,614,423 | B2 * | 12/2013 | Chen et al. ................ 250/370.13 |
| 2004/0238338 | A1* | 12/2004 | Ganz et al. .................... 200/262 |
| 2005/0284257 | A1* | 12/2005 | Osada et al. .................... 75/228 |
| 2006/0197542 | A1* | 9/2006 | Tanaka .......................... 324/754 |
| 2007/0194243 | A1* | 8/2007 | Chen et al. ................ 250/370.13 |
| 2008/0149844 | A1* | 6/2008 | Chen et al. ................ 250/370.13 |
| 2008/0157255 | A1* | 7/2008 | Kominami et al. ........... 257/459 |
| 2010/0193694 | A1* | 8/2010 | Chen et al. ................ 250/370.01 |
| 2012/0267737 | A1* | 10/2012 | Chen et al. .................... 257/429 |
| 2013/0126999 | A1* | 5/2013 | Rusian et al. ................. 257/428 |
| 2013/0266114 | A1* | 10/2013 | Chen et al. ..................... 378/10 |
| 2014/0083486 | A1* | 3/2014 | Kim et al. ..................... 136/249 |

OTHER PUBLICATIONS

Jurgen J. Maerz, "Platinum Alloys—Features and Benefits", http://www.ganoksin.com/borisat/nenam/platinum-alloys.htm, 6 pp., 2004.

Steven Kretchmer, "Plat/S+™ Innovative General Purpose Platinum Alloy transforming Goldsmiths into Platinumsmiths," Platinum Guild International, USA, 1999.

* cited by examiner

VICKERS HARDNESS OF ANNEALED PLATINUM ALLOYS AS A FUNCTION OF ALLOY COMPOSITION

SEMICONDUCTOR RADIATION DETECTOR WITH THIN FILM PLATINUM ALLOYED ELECTRODE

CROSS REFERENCE TO RELATED APPLICATION

This application claims priority from U.S. Provisional Patent Application No. 61/022,836, filed Jan. 23, 2008, which is incorporated herein by reference.

BACKGROUND OF THE INVENTION

1. Field of the Invention

The present invention relates to semiconductor radiation detectors and, more particularly, to the configuration of an electrode formed on at least one surface of the semiconductor radiation detector.

2. Description of Related Art

Cathode electrodes and anode electrodes of Cadmium Zinc Telluride (CZT) radiation detectors are presently formed of platinum thin films. The platinum forming each electrode is deposited via a suitable thin film deposition technique, such as, without limitation, sputtering, to a thickness of approximately 1000 angstroms. However, this thickness is not to be construed in a limiting sense.

Each platinum electrode defines an electronic contact that enables the CZT bulk material to have superior performance when acting as an x-ray or gamma-ray radiation detector and to interface with electronics with sufficient connectivity to allow for data acquisition and control electronics to form a functional and high performance CZT detector based sensor.

In the case of a CZT detector based sensor system, platinum electrodes provide for the proper work function and chemical bond to the CZT bulk material such that the work function matches the CZT bulk material's bandgap, resistivity, and interface electronic properties, thereby enabling the CZT bulk material, or other suitable compound semiconductor crystal material, to realize full depletion of the entire CZT bulk material volume with excellent collection of charge carriers generated by the absorbed x-rays and gamma rays. The high sensitivity provided by the full depletion of the entire CZT bulk material volume and the good charge collection ensures nearly loss free signal generation from absorbed photons and provides higher performance levels of CZT based detectors than many other semiconductor detectors.

In the manufacture of compound semiconductor devices, such as CZT detectors, the mechanical fragility of the delicate thin platinum electrode metal prohibits the use of robust manufacture methods to fabricate these devices. Specifically, after deposition, the delicate thin-film platinum electrodes are easily damaged during subsequent device fabrication steps such as, without limitation: in-line probe testing; device handling during downstream device processing; and bonding to interconnect substrates or read-out electronics during integration to signal processing electronics.

One means of compensation for the fragility of thin platinum electrodes involves the subsequent deposition of an excessively thick second pure metal layer (typically gold) using a suitable thick film deposition technique and, if desired, a third pure metal layer (typically vanadium) using a suitable thick film deposition technique to protect the underlying platinum layer and provide a (deformable) buffer layer between the underlying platinum layer and probe contacts, bonding bumps, in-line device handling tools, and the like. The application of one or more excessively thick film metal layers, however, is impractical and costly with thin-film equipment, whereupon this approach requires the implementation of alternative thick-film deposition processes into the CZT detector fabrication process. With excessive film thickness, however, there is also the confounding relationship that film conformality to its substrate is reduced, thus resulting in the potential for electrodes to delaminate from the underlying surface. Excessive electrode thickness is also not desirous from a device reliability perspective.

The current state of the art in the fabrication of CZT detectors, and other compound semiconductor devices, has not produced devices with acceptably robust electrode structures which are capable of being mechanically probed prior to bonding of device pixel and full-area electrodes to interconnect substrates or read-out electronics. Existing CZT detectors are frequently damaged when probed in-process, thus requiring repeated and excessive processing to allow for such processing. An illustration of induced pin-probe damage on prior art platinum electrodes is shown in FIGS. 1A and 1B.

The performance and cost of CZT detectors, and other compound semiconductor devices, would greatly benefit from in-process probe testing thereof before proceeding further in the manufacturing cycle. This would provide for opportunities to improve production efficiency and reduce manufacturing costs for the fabrication of these detectors. For example, knowing ahead of the completed/mounted CZT detector manufacture that the CZT detector is either functional, non-functional, or partially functional, would enable decisions to be made to further process, reject, or selectively bin the CZT detector by quality level for subsequent final device manufacture disposition, respectively.

After deposition on a CZT detector, platinum electrodes are soft and frequently scratched during subsequent handling and manufacture of CZT detectors into radiation detectors. Even minor scratching of these delicate platinum electrodes can cause damage to the underlying CZT-to-metal interface and the generation of electronic noise in use of the CZT detector. At a minimum, this damage can deteriorate the performance and reduce the operability range (bias voltage, temperature) of the CZT detector. Often this damage is catastrophic and renders the CZT detector unusable for its intended application. When scratched, a CZT detector may require rework, re-metallization, or may be lost as scrap. Often the weight of a CZT detector on a so-called clean room wipe is all that is required to damage these delicate platinum electrodes alone or platinum electrodes having one or more suitable overlayers, such as, without limitation, a gold overlayer, or the combination of gold and vanadium overlayers.

Another area where more robust platinum electrodes would greatly improve fabrication yields and the short and long-term reliability of CZT detectors is during the bonding of the CZT detectors to interconnect substrates or read-out electronics. Typically, some form of flip-chip bonding is used to integrate CZT detectors to readout electronics (e.g., conductive epoxy bump bonding, low temperature solder bonding, gold stud bonding, ball-grid arrays, unidirectional conductive epoxy bonding and the like). All of these interconnect technologies employ dissimilar materials and wide curing/processing temperature cycles to achieve the required electrode/pixel connectivity. Thermo-mechanical stresses induced during the bonding process and long-term mechanical fatigue as a result of thermal cycles are the two main causes of connectivity failure. In case of delicate compound semiconductors, such as CZT, metal film damage can occur to the semiconductor-to-metal interface of a platinum electrode during both the bonding process, as a result of applied forces and thermo-mechanical stresses, and in the field during use due to thermal cycling induced interface fatigue and failure.

Hardening the platinum electrodes or multi-layer electrode described above would reduce device failure during the bonding process and improve the long-term reliability of the CZT detector in the field. Moreover, a hardened platinum layer by itself or in combination with a second and, if desired, a third layer would serve as a stress and strain barrier against mechanical deformation during the bonding process and subsequent use in the field while maintaining the favorable electrical properties of the barrier at the semiconductor-platinum interface.

However, common methods of work hardening, such as thermal processing to create tempering, are not permissible processes by which to improve electrode mechanical durability for many compound semiconductor crystals. For example, the detector material CZT is mechanically sensitive and work hardening is not a viable option for a platinum electrode of a CZT detector. CZT material is also thermally sensitive to temperatures above approximately 200° C. and such temperatures may not be employed as the device performance degrades due to thermally induced material changes. This eliminates bulk thermal processing as a method by which mechanical characteristics of the platinum may be improved.

SUMMARY OF THE INVENTION

Disclosed is an application and method of fabricating an electrode of a semiconductor device that is comprised of a hardened platinum layer that is hardened desirably without heat treatment, annealing, tempering, or cold working to achieve target hardness characteristics.

More specifically, a compound semiconductor radiation detector comprises a body of compound semiconducting material (such as CZT) having an electrode disposed on at least one surface thereof. Said electrode is comprised of a layer of a compound of a first element and a second element. The first element is platinum and the second element is comprised of at least one of the following: chromium, cobalt, gallium, germanium, indium, molybdenum, nickel, palladium, ruthenium, silicon, silver, tantalum, titanium, tungsten, vanadium, zirconium, manganese, iron, magnesium, copper, tin, and gold.

The layer desirably has a hardness greater than that of platinum, e.g., a Vickers hardness greater than 100.

The electrode can include another layer comprised of either gold or platinum deposited atop of the layer of the compound of the first element and the second element.

The electrode can include between the body of the compound semiconducting material and the layer of the compound of the first element and the second element another layer comprised of platinum, nickel, palladium, gold, molybdenum, tungsten, iron, chromium, titanium, aluminum, silver, tantalum, indium, iridium, ruthenium or cesium.

The body of compound semiconducting material can comprise cadmium, zinc, and telluride (CZT).

When the second element is either chromium, cobalt, gallium, germanium, molybdenum, nickel, silicon, silver, tantalum, titanium, vanadium, zirconium, manganese, iron, magnesium, copper, tin, or gold, the compound of the first and second elements is desirably comprised of between 1 wt. % and 5 wt. % of the second element and is more desirably comprised of between 1 wt. % and 3 wt. % of the second element.

When the second element is either indium, ruthenium, or tungsten, the compound is desirably comprised of between 1 wt. % and 10 wt. % of the second element and is more desirably comprised of between 4 wt. % and 6 wt. % of the second element.

When the second element is palladium, the compound is desirably comprised of between 1 wt. % and 25 wt. % of the second element and is more desirably comprised of between 10 wt. % and 12 wt. % of the second element.

The first layer can be formed by a physical vapor deposition (PVD) process from a source of vapor that is either a single source comprised of suitable levels of the first and second elements or separate first and second sources of the first and second elements, respectively.

The first layer can comprise a plurality of sublayers, each of which is comprised of a different one of the second elements and platinum as the first element. Each sublayer can be formed by a physical vapor deposition (PVD) process. Each sublayer can be fabricated in a series of step function changes between the sublayers, or as a dynamic gradient of the first and second elements, or a combination of both a stepwise composition and a gradient composition within the first layer.

DETAILED DESCRIPTION OF THE INVENTION

Figure 1A:
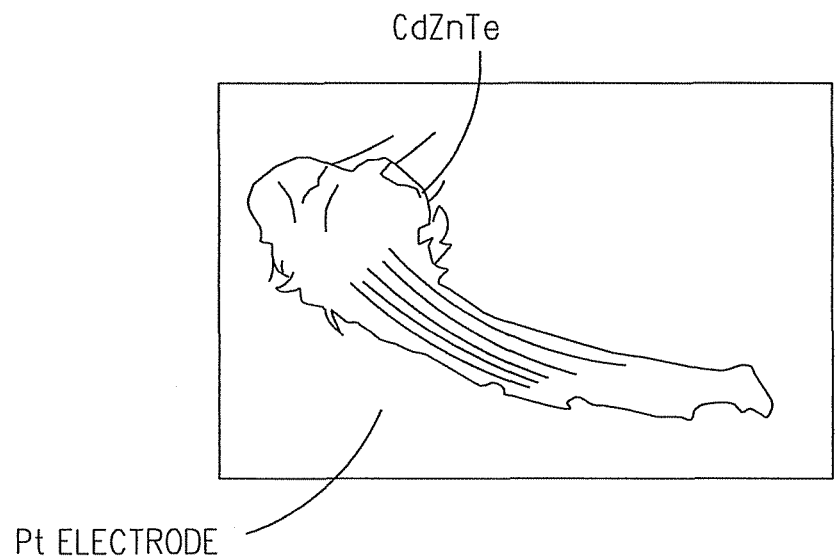
FIGS. 1A and 1B are enlarged photographs showing typical damage caused by a probe pin to 1000 angstrom thick pure platinum electrodes on CZT substrates.
Figure 1B:
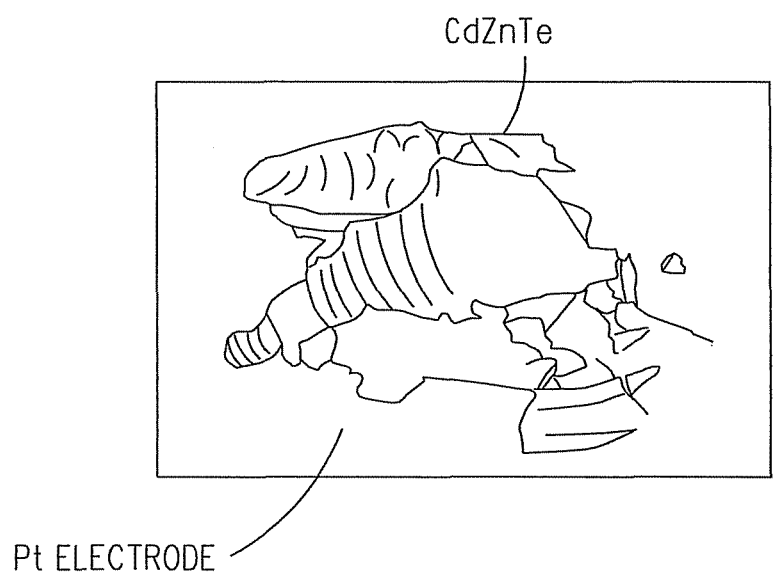

Embodiments of the invention will be described with reference to the accompanying figures where like reference numbers correspond to like elements.

Alloy hardened platinum thin film electrodes are employed on semiconductor devices, e.g., a CZT detector, by forming the platinum alloy during a thin film deposition process. The increased hardness of the hardened platinum thin film electrodes enable the use of a thinner alloy film alone or in combination with other metal films as the electrode material structure. The platinum alloy provides favorable work function and chemical bonding properties close to those of pure platinum films—advantageous for CZT radiation detector operation. Alternatively, the hardened platinum alloy film can be combined with a thin (100-500 angstroms) pure platinum contact (base) layer to serve as the electrical contact and diffusion barrier for the platinum alloy film.

The choice of a platinum alloy film or a multi-layer film structure that includes a platinum alloy film layer satisfies several design criteria. First, the platinum alloy film provides sufficiently strong adhesion to the CZT crystal. To this end, pure platinum films have been observed to have very good adhesion properties to oxide-free or slightly oxidized surface(s) of CZT crystals. The increased mechanical moduli of the various platinum alloys disclosed herein is believed to also provide improved adhesion thereof to the surface(s) of CZT crystals.

Other aspects of the platinum alloys disclosed herein include elemental stability and resistance to oxidations whereupon the properties of the electrical contacts formed thereby do not degrade with age or exposure to environmental conditions, particularly when used as an outer metal electrode coating without encapsulation.

Some alloying materials that harden metals, such as platinum, are not compatible with the operation of a compound semiconductor device as "poisoning" of the active material may occur. For example, copper hardens platinum, but also adversely affects the functionality of CZT detectors. Accordingly, copper would ordinarily not be used for hardening a platinum electrode of a CZT detector. However, if a thin film deposition process and/or a multi-layer structure were able to prevent the diffusion of the copper of a copper hardened platinum electrode into the CZT crystal under fabrication process conditions and temperatures, then copper could be used.

Thin film deposition characteristics also prevent some metals from being used in electronic applications. Gold hardens platinum, but also presents problems of potential bulk device diffusion and accompanying device doping effects and thin film adhesion problems, and would therefore not be the ideal choice for hardening of a platinum electrode of a CZT detector.

Mechanical hardening can be achieved in platinum by alloying with other metals from the platinum group with good hardness and electrical properties. The Vickers hardness of pure platinum is approximately 60. The platinum group metals include: palladium, iridium, osmium, ruthenium, and rhodium, all of which may be used individually or in combination with platinum to form a hardened platinum electrode. In other words, one or more of these hardening metals may be included in the platinum to produce a 2-, 3-, or more compound composition hardened alloy of platinum.

Other metals also known to harden platinum from its pure state hardness value include: chromium, cobalt, gallium, germanium, indium, molybdenum, nickel, tantalum, titanium, tungsten, vanadium, and zirconium.

Figure 2:
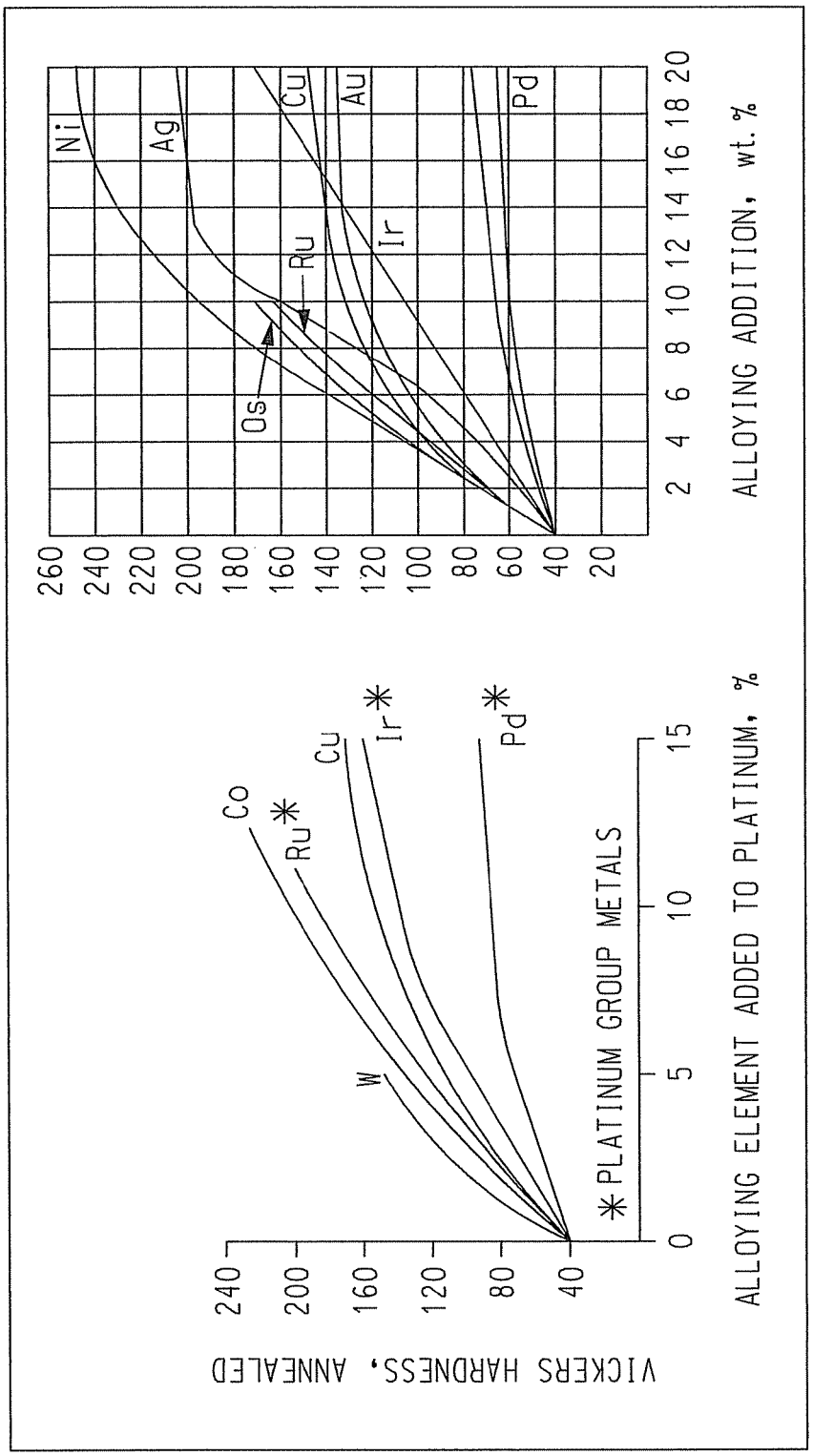
FIG. 2 are graphs of Vickers hardness of annealed platinum alloys as a function of alloy composition.

With reference to FIG. 2, the concentration of most alloying metals in platinum produces a graph of concentration versus hardness that generally increases in concentration and resultant hardness with increasing concentration of the alloying metal, frequently to a point where the increased addition of the alloying metal does not produce further gains in hardness. This is illustrated in FIG. 2 which shows the Vickers hardness of a number of different platinum alloys as the function of alloy composition for a number of alloying metals.

The maximum achievable hardness of some selected platinum alloys is shown in the following Table 1. The use of hardening alloying metals in platinum sufficiently increases the hardness of the platinum to enable test probing and characterization of compound semiconductor detectors, e.g., CZT detectors, in process.

TABLE 1

| Material | Vickers Hardness (HV) |
| --- | --- |
| Pure Platinum | 60 |
| Platinum + 2% Chromium | 112* |
| Platinum + 2% Cobalt | 94* |
| Platinum + 5% Cobalt | 135 |
| Platinum + 3% Cobalt & 7% Palladium | 125 |
| Platinum + 5% Cobalt & 10% Palladium | 150 |
| Platinum + 2% Gallium | 124* |
| Platinum + 2% Germanium | 305* |
| Platinum + 2% Indium | 133* |
| Platinum + 1.5% Indium & 3% Gallium | 225 |
| Platinum + 5% Iridium | 80 |
| Platinum + 2% Molybdenum | 129* |

TABLE 1-continued

| Material | Vickers Hardness (HV) |
| --- | --- |
| Platinum + 2% Nickel | 100* |
| Platinum + 10% Palladium | 80 |
| Platinum + 15% Palladium | 90 |
| Platinum + 5% Ruthenium | 135 |
| Platinum + 2% Silicon | 339* |
| Platinum + 2% Silver | 92* |
| Platinum + 2% Tantalum | 113* |
| Platinum + 2% Titanium | 214* |
| Platinum + 2% Tungsten | 101* |
| Platinum + 5% Tungsten | 135 |
| Platinum + 2% Vanadium | 157* |
| Platinum + 2% Zirconium | 207* |
| Platinum + 2% Chromium | 112* |

*Relatively Low Temp Annealed (600° C. for 20 min)

As shown in Table 1, typical hardening alloying concentrations in platinum are desirably in the range of 1% to 15%. One consideration for using hardening alloying metals in platinum electrodes in CZT detectors is the preservation of the metal-to-compound semiconductor interface region to retain (or improve) typical detector performance, which is in part dependant upon the electronic characteristics and electronic properties of the electrode material.

Each hardened thin film electrode may comprise a standalone alloyed hardened platinum layer, or an alloyed hardened platinum layer as part (e.g., the base layer) of a multi-layer electrode structure. Either such hardened alloyed layer is predominantly platinum, desirably between 60% and 100% platinum, exclusive, and more desirably between 80% and 99% platinum, inclusive. A multi-layer electrode may include an alloyed hardened platinum layer coated with one or more other thin film electrical contact layer(s), such as gold, to form the multi-layer electrode structure. One or a combination of these hardened thin film electrodes may be used as electrical contacts of a compound semiconductor radiation detector, e.g., a CZT detector, or a radiation detection device made mainly of compound semiconductor materials from the II-VI or III-V compound semiconductor classes.

The alloyed hardened platinum as a sole layer or component layer of an electrode of a semiconductor radiation sensing device is a thin film with a thickness desirably in the range of approximately 800 angstroms to 2 microns and more desirably in the range between 1,000 angstroms to 10,000 angstroms. The alloyed hardened platinum layer is deposited or grown onto the semiconductor surface, or upon an appropriate thin film adhesion layer, by classical thin film PVD (physical vapor deposition) methods such as sputtering or evaporation. The alloyed hardened platinum layer described herein, as applied by a suitable PVD method, has an increased hardness versus the hardness of pure platinum and does not require annealing, tempering or other high temperature processing. If desired, the PVD method may be used to co-deposit or tri-deposit various alloy constituents from suitable sources. This allows for custom alloying composition and potential for gradient compositional growth versus coating thickness.

The embodiments of the hardened platinum electrode layers described herein have a Vickers hardness approaching and desirably exceeding 100—slightly less than twice that of pure platinum which has a Vickers hardness of approximately 60. However, this is not to be construed in a limiting sense since it is envisioned that a hardened platinum electrode layer having a Vickers hardness between 60 and 100 may also be used, if desired.

Various embodiment electrodes useable with a compound semiconductor radiation detector, such as CZT, will now be described with reference to FIGS. 3-6.

Figure 3:
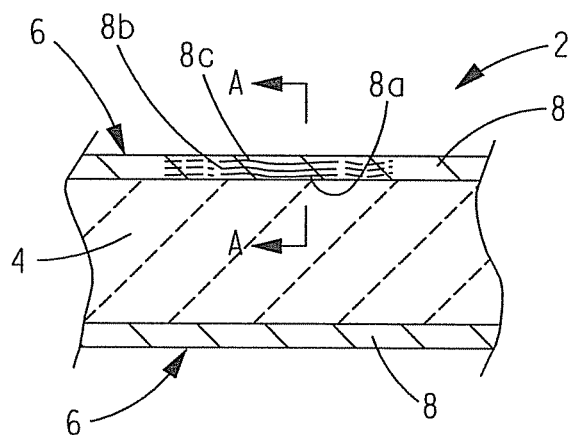
FIG. 3 is a cross sectional view of a compound semiconductor material (such as CZT) that includes electrodes in accordance with the various embodiments of electrodes disclosed herein.

With reference to FIG. 3, an embodiment of a compound semiconductor radiation detector 2 includes a body 4 of compound semiconducting material (e.g., CZT) having one or more electrodes 6 disposed on one or more surfaces thereof. Each electrode 6 is comprised of a layer 8 of a compound (or alloy) of a first element platinum and a second element comprised of chromium, cobalt, gallium, germanium, indium, molybdenum, nickel, palladium, ruthenium, silicon, silver, tantalum, titanium, tungsten, vanadium, zirconium, manganese, iron, magnesium, copper, tin, or gold. Desirably, first layer 8 has a hardness greater than that of platinum, e.g., first layer 8 has a Vickers hardness greater than 100.

When the second element is either chromium, cobalt, gallium, germanium, molybdenum, nickel, silicon, silver, tantalum, titanium, vanadium, zirconium, manganese, iron, magnesium, copper, tin, or gold, the compound of the first and second elements is desirably between 1 wt. % and 5 wt. % of the second element and more desirably between 1 wt. % and 3 wt. % of the second element.

When the second element is either indium, ruthenium, or tungsten, the compound of the first and second elements desirably includes between 1 wt. % and 10 wt. % of the second element and more desirably includes between 4 wt. % and 6 wt. % of the second element.

When the second element is palladium, the compound of the first and second elements desirably includes between 1 wt. % and 25 wt. % of the second element and more desirably includes between 10 wt. % and 12 wt. % of the second element.

Figure 4:
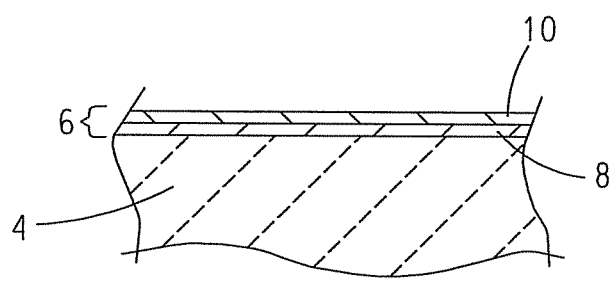
FIG. 4 is a section taken along lines A-A in FIG. 3, showing one embodiment electrode.

With reference to FIG. 4 and with continuing reference to FIG. 3, in another embodiment, each electrode 6 can also or alternatively include another layer 10, comprised of either gold or platinum, deposited atop of layer 8.

Figure 5:
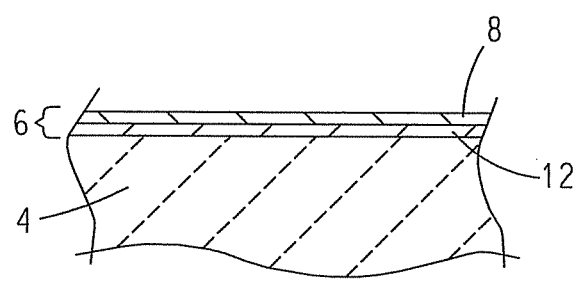
FIG. 5 is a section taken along lines A-A in FIG. 3, showing another embodiment electrode.

With reference to FIG. 5 and with continuing reference to FIGS. 3 and 4, in another embodiment, each electrode 6 can also or alternatively include, between body 4 of compound semiconducting material and layer 8, another layer 12 comprised of platinum, nickel, palladium, gold, molybdenum, tungsten, iron, chromium, titanium, aluminum, silver, tantalum, indium, iridium, ruthenium, or cesium.

Figure 6:
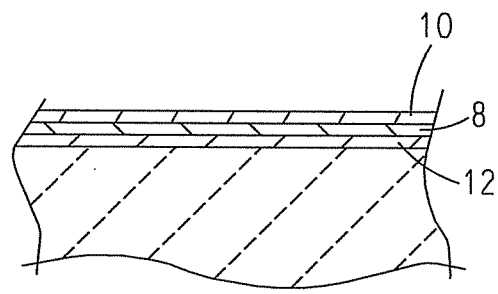
FIG. 6 is a section taken along lines A-A in FIG. 3, showing yet another embodiment electrode.

With reference to FIG. 6 and with continuing reference to FIGS. 3-5, in another embodiment, each electrode 6 can also or alternatively include layer 12 between body 4 of compound semiconducting material and layer 8, and layer 10 atop of layer 8.

Body 4 of compound semiconducting material can be comprised of cadmium, zinc and telluride (CZT). Each layer 8, 10 and 12, especially layer 8, can be formed by a physical vapor deposition (PVD) process. Layer 8 can be PVD deposited from a source of vapor that is either a single source comprised of suitable levels of the first and second elements, or separate first and second sources of the first and second elements, respectively.

If desired, layer 8 can comprise a plurality of sublayers, e.g. 8a, 8b, 8c in FIG. 3, each of which is comprised of a different one of the second elements and platinum as the first element. Each sublayer can be formed by a physical vapor deposition (PVD) process.

The physical vapor deposition of an alloy hardened platinum electrode of a CZT detector increases the mechanical durability of the resulting electrode over electrodes formed from pure (or substantially pure) platinum alone. By the addition of a controlled minority level of hardening alloy agent to the platinum, substantially the same electronic properties of traditional platinum electrodes are retained in the function of the electrode-to-compound semiconductor interface, which contributes to the overall performance of the device. The nature of the work function, chemical bonding, and stability properties of the alloy hardened platinum electrode are expected to be similar to the host platinum and should provide similar or improved CZT detector performance versus a CZT detector formed having electrodes formed from platinum only.

It is envisioned that the embodiments of the electrodes disclosed herein will be mechanically superior metallic electrodes for CZT x-ray and gamma-ray detectors compared to prior art electrodes comprised of a layer of platinum alone. It is also envisioned that the embodiments of the electrodes disclosed herein will have a reduced sensitivity to mechanical damage from handling (scratches), testing (pin-probe damage), and bonding processes, which, in turn, increases the manufacture yields of the CZT detector. In addition, it is envisioned that the long-term reliability of such CZT detectors will be improved due to reduced sensitivity of the CZT detectors to interconnect failure resulting from thermal cycling.

The invention has been described with reference to the preferred embodiments. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A semiconductor radiation detector comprising:
   a body of compound semiconducting material, said compound conducting material comprising a compound of cadmium, zinc, and telluride (CZT); and
   an electrode disposed on at least one surface of the body, said electrode comprising a first layer of an alloy of a first element and a second element, wherein said first element is platinum and said second element is selected from the group consisting of chromium, cobalt, gallium, germanium, indium, molybdenum, tantalum, vanadium, zirconium, manganese, iron, and magnesium, and wherein the electrode has a Vickers hardness of at least as great as 100.

2. The radiation detector of claim 1, wherein the first layer has a hardness greater than that of platinum.

3. The radiation detector of claim 2, wherein the first layer has a Vickers hardness greater than 100.

4. The radiation detector of claim 1, wherein the electrode includes a second layer deposited on a side of the first layer opposite the compound semiconducting material, said second layer comprising one of the group: gold and platinum.

5. The radiation detector of claim 4, wherein the electrode includes a third layer sandwiched between the body of the compound semiconducting material and the first layer, said third layer comprised of one of the following elements: platinum, nickel, palladium, gold, molybdenum, tungsten, iron, chromium, titanium, aluminum, silver, tantalum, indium, iridium, ruthenium, and cesium.

6. The radiation detector of claim 1, wherein the electrode includes a second layer sandwiched between the body of compound semiconducting material and the first layer, said second layer comprised of one of the following elements: nickel, molybdenum, tungsten, iron, chromium, titanium, aluminum, tantalum, indium, iridium, and cesium.

7. The radiation detector of claim 1, wherein, when the second element is either chromium, cobalt, gallium, germanium, molybdenum, tantalum, vanadium, zirconium, manganese, iron, or magnesium, the compound is comprised of between 1 wt. % and 5 wt. % of the second element.

8. The radiation detector of claim 7, wherein the compound is comprised of between 1 wt. % and 3 wt. % of the second element.

9. The radiation detector of claim 1, wherein, when the second element is indium, the alloy comprises between 1 wt. % and 10 wt. % of indium.

10. The radiation detector of claim 9, wherein the alloy comprises between 4 wt. % and 6 wt. of indium.

11. The radiation detector of claim 1, wherein the alloy comprises between 10 wt. % and 12 wt. % of the second element.

12. The radiation detector of claim 1, wherein:
the first layer is formed by a physical vapor deposition (PVD) process; and
a source of vapor for the PVD process is either:
a single source comprised of suitable levels of the first and second elements; or
separate first and second sources of the first and second elements, respectively.

13. The radiation detector of claim 1, wherein the first layer comprises a plurality of sublayers, each of which is comprised of a different one of the second elements and platinum as the first element.

14. The radiation detector of claim 4, wherein each layer is formed by a physical vapor deposition (PVD) process.

15. The radiation detector of claim 5, wherein each layer is formed by a physical vapor deposition (PVD) process.

16. The radiation detector of claim 6, wherein each layer is formed by a physical vapor deposition (PVD) process.

\* \* \* \* \*